(12) United States Patent
Lee et al.

(10) Patent No.: US 12,127,353 B2
(45) Date of Patent: Oct. 22, 2024

(54) DISPLAY APPARATUS

(71) Applicant: SAMSUNG ELECTRONICS CO., LTD., Suwon-si (KR)

(72) Inventors: Jiwon Lee, Suwon-si (KR); Sungyong Joo, Suwon-si (KR); Junhyun Won, Suwon-si (KR); Taejun You, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 201 days.

(21) Appl. No.: 17/687,962

(22) Filed: Mar. 7, 2022

(65) Prior Publication Data
US 2022/0386481 A1    Dec. 1, 2022

Related U.S. Application Data

(63) Continuation of application No. PCT/KR2022/002544, filed on Feb. 22, 2022.

(30) Foreign Application Priority Data

May 25, 2021    (KR) .................. 10-2021-0067214

(51) Int. Cl.
*H05K 5/00*    (2006.01)
*H05K 1/18*    (2006.01)
*H05K 5/02*    (2006.01)

(52) U.S. Cl.
CPC .......... *H05K 5/0017* (2013.01); *H05K 1/181* (2013.01); *H05K 5/0204* (2013.01); *H05K 2201/10128* (2013.01)

(58) Field of Classification Search
CPC . H05K 1/11; H05K 1/115; H05K 1/18; H05K 1/181–187; H05K 1/02;
(Continued)

(56) References Cited

U.S. PATENT DOCUMENTS 3,190,953 A  *  6/1965 Keller .................. H01R 12/58
                                              174/262
3,880,493 A  *  4/1975 Lockhart, Jr. ........ H05K 7/1092
                                              257/532
(Continued)

FOREIGN PATENT DOCUMENTS

EP    0 331 818    9/1989
JP    H07-183651   7/1995
(Continued)

OTHER PUBLICATIONS

Search Report dated Jun. 21, 2022 in counterpart International Patent Application No. PCT/KR2022/002544 and English-language translation.

(Continued)

*Primary Examiner* — Tuan T Dinh
(74) *Attorney, Agent, or Firm* — Nixon & Vanderhye, P.C.

(57) ABSTRACT

Provided is a display apparatus. The display apparatus includes: a display panel; a chassis supporting the display panel; a printed circuit board on which an electronic component is mounted; and a supporter inserted in the printed circuit board, wherein the printed circuit board includes a first surface facing the chassis, a second surface facing a direction opposite to the first surface, and a through hole penetrating the first surface and the second surface. The supporter includes: a head fixed on the second surface of the printed circuit board; a first body positioned inside the through hole, and extending from the head toward the chassis; and a second body extending from the first body, and protruding from the through hole toward the chassis.

12 Claims, 17 Drawing Sheets

(58) Field of Classification Search
CPC .... H05K 3/308; H05K 3/3447; H05K 3/4046; H05K 5/0017; H05K 5/0204; H05K 2201/10128; H05K 2201/10757; H05K 2201/10257; H05K 2201/10401; G02F 1/13452; G02F 1/626
USPC .... 361/785, 2–759, 801, 807–810, 752–759, 361/816; 174/138 G, 138 F, 258–264, 174/818
See application file for complete search history.

(56) References Cited

U.S. PATENT DOCUMENTS

| | | | | |
|---|---|---|---|---|
| 4,070,077 | A * | 1/1978 | Clark | H05K 3/4046 |
| | | | | 439/876 |
| 5,115,375 | A * | 5/1992 | Garay | H05K 7/142 |
| | | | | 439/82 |
| 5,281,770 | A * | 1/1994 | Kamei | H01R 12/58 |
| | | | | 174/266 |
| 5,815,917 | A | 10/1998 | Clark et al. | |
| 6,084,296 | A * | 7/2000 | Colello | H05K 1/0209 |
| | | | | 257/723 |
| 6,424,537 | B1 * | 7/2002 | Paquin | H05K 7/142 |
| | | | | 361/752 |
| 6,923,691 | B2 * | 8/2005 | Ireland | H05K 7/142 |
| | | | | 439/876 |
| 7,473,111 | B2 * | 1/2009 | Konishi | H05K 3/308 |
| | | | | 439/82 |
| 8,854,836 | B2 | 10/2014 | Deng et al. | |
| 8,961,198 | B2 | 2/2015 | Ferran Palau et al. | |
| 9,443,402 | B2 | 9/2016 | Olodort | |
| 10,804,686 | B2 | 10/2020 | Goebbels et al. | |
| 10,995,487 | B2 * | 5/2021 | Cabaj | E04B 1/4157 |
| 2003/0045139 | A1 * | 3/2003 | Hanson | H01R 13/6658 |
| | | | | 439/82 |
| 2008/0094790 | A1 * | 4/2008 | Song | H05K 3/3447 |
| | | | | 361/752 |
| 2012/0127681 | A1 * | 5/2012 | Ryu | H05K 3/3447 |
| | | | | 174/126.1 |
| 2015/0237757 | A1 * | 8/2015 | Lor | G06F 1/16 |
| | | | | 361/752 |

FOREIGN PATENT DOCUMENTS

| | | |
|---|---|---|
| JP | H09-147940 | 6/1997 |
| KR | 20-1998-0054308 | 10/1998 |
| KR | 10-2005-0123234 | 12/2005 |
| KR | 10-2006-0087760 | 8/2006 |
| KR | 10-0766899 | 10/2007 |
| KR | 10-0814810 | 3/2008 |
| KR | 10-2431415 | 8/2022 |

OTHER PUBLICATIONS

1 Extended Search Report dated Jul. 1, 2024 in European Patent Application No. 22811447.6.

* cited by examiner

DISPLAY APPARATUS

CROSS-REFERENCE TO RELATED APPLICATIONS

This application is a continuation of International Application No. PCT/KR2022/002544 designating the United States, filed on Feb. 22, 2022, in the Korean Intellectual Property Receiving Office and claiming priority to Korean Patent Application No. 10-2021-0067214, filed on May 25, 2021 in the Korean Intellectual Property Office, the disclosures of which are incorporated by reference herein in their entireties.

BACKGROUND

1. Field

The disclosure relates to a display apparatus and a manufacturing method thereof, and for example, to a display apparatus having a supporter and a manufacturing method thereof.

2. Description of Related Art

A printed circuit board (PCB) is formed by printing a circuit line pattern with a conductive material such as copper on an electrically insulating board, and may refer, for example, to a board on which electronic components can be mounted. The printed circuit board is widely used in an electronic device, such as a display, a laptop computer, a mobile phone, etc.

Recently, electronic devices are more and more miniaturized and slimmed. Accordingly, electronic components, etc. mounted on a printed circuit board are nearly in contact with a housing (for example, a chassis, a cover, etc.). In this case, the electronic components are easily damaged by external vibrations, impacts, etc., and the insulating sheet may be scratched by leads of the electronic components. Furthermore, when the printed circuit board is pressed by the housing, a problem that electrical shorts are generated or the printed circuit board is bent may be generated.

To address such a problem, a PCB supporter for supporting the printed circuit board is installed in the printed circuit board. However, a manual insert supporter requires a worker's task of inserting it into a printed circuit board and then performing bonding for fixing it, which deteriorates productivity. Also, a surface mounted device (SMD) supporter raises manufacturing cost because it is a high-priced product.

SUMMARY

Embodiments of the disclosure provide a display apparatus including a supporter capable of protecting electronic components and preventing and/or reducing an insulating sheet from being scratched.

Embodiments of the disclosure provide a display apparatus including a supporter capable of fixing leads of components.

Embodiments of the disclosure provide a display apparatus including a supporter capable of forming a via hole.

Embodiments of the disclosure provide a display apparatus manufacturing method for improving productivity.

Additional aspects of the disclosure will be set forth in part in the description which follows.

A display apparatus according to an example embodiment of the disclosure includes: a display panel; a chassis supporting the display panel; a printed circuit board on which an electronic component is mounted, the printed circuit board including a first surface facing the chassis, a second surface facing a direction opposite to the first surface, and a through hole penetrating the first surface and the second surface; and a supporter inserted in the through hole, wherein the supporter includes: a head fixed on the second surface of the printed circuit board; a first body positioned inside the through hole and extending from the head toward the chassis; and a second body extending from the first body, and protruding from the through hole of the printed circuit board toward the chassis to block the electronic component mounted on the printed circuit board from interfering with the chassis.

The head of the supporter may be clinched in an auto insert process.

The second body may further include a bent portion adjacent to the chassis.

The second body may further include an extension portion extending from the bent portion toward the first surface of the printed circuit board.

A width of the second body may be greater than a width of the first body.

The second body may further include a projection having a width greater than a width of the through hole such that the supporter is configured to be caught by the first surface upon inserting into the through hole.

A lead of the electronic component mounted on the printed circuit board may protrude toward the chassis with respect to the first surface of the printed circuit board, and a length of the second body may be greater than a length of a portion of the lead of the electronic component, the portion protruding outward of the printed circuit board from the first surface.

The lead may be located inside the supporter, and the lead may be fixed in the supporter by soldering.

The second body may further include a plurality of solder reinforcement holes arranged along a circumferential direction.

The head may be soldered on the second surface, the second body may be soldered on the first surface, and a via hole may be provided inside the supporter.

The display apparatus may further include an insulating sheet positioned on one side of the chassis facing the first surface of the printed circuit board, and the second body may be spaced from the insulating sheet.

The display apparatus may further include a cover spaced from the chassis, the head of the supporter may be located between the second surface of the printed circuit board and the cover, and the second body of the supporter may be located between the first surface of the printed circuit board and the chassis.

A display apparatus according to an example embodiment of the disclosure includes: a display panel; a light source device comprising light emitting circuitry configured to provide light to the display panel; and a printed circuit board assembly configured to supply power to at least one of the display panel or the light source device, wherein the printed circuit board assembly includes: a printed circuit board including a through hole and a mounting surface on which an electronic component is mounted; and a supporter inserted in the through hole, wherein the supporter includes: a first body located inside the through hole; a clinch head extending from the first body toward the mounting surface and fixed on the mounting surface; and a second body extending from the first body to be spaced from the mounting surface, and located outside the through hole.

The second body may further include a projection blocking the supporter from escaping from the through hole based on insertion of the supporter into the through hole.

A width of the second body may be greater than a width of the first body.

The display apparatus may further include a chassis supporting the display panel, and the second body may further include a bent portion adjacent to the chassis.

The second body may further include an extension portion supporting an opposite surface of the mounting surface and extending from the bent portion toward the opposite surface of the mounting surface.

The lead of the electronic component may be positioned inside the supporter, and the lead may be fixed in the supporter by soldering.

The clinch head may be soldered on the mounting surface, the second body may be soldered on the opposite surface of the mounting surface, and a via hole may be provided inside the supporter.

A method for manufacturing a display apparatus, according to an example embodiment of the disclosure, the display apparatus including a display panel and a chassis supporting the display panel, includes: preparing a printed circuit board including a mounting surface on which an electronic component is mounted, a reverse surface opposite to the mounting surface, and a through hole penetrating the mounting surface and the reverse surface; inserting the supporter into the through hole from the reverse surface through an auto insert process such that a first portion of the supporter protrudes with respect to the reverse surface of the printed circuit board; clinching a second portion of the supporter, the second portion protruding from the mounting surface of the printed circuit board, to fix the second portion on the mounting surface; and installing the printed circuit board in the chassis such that the first portion of the supporter is located between the reverse surface of the printed circuit board and the chassis.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
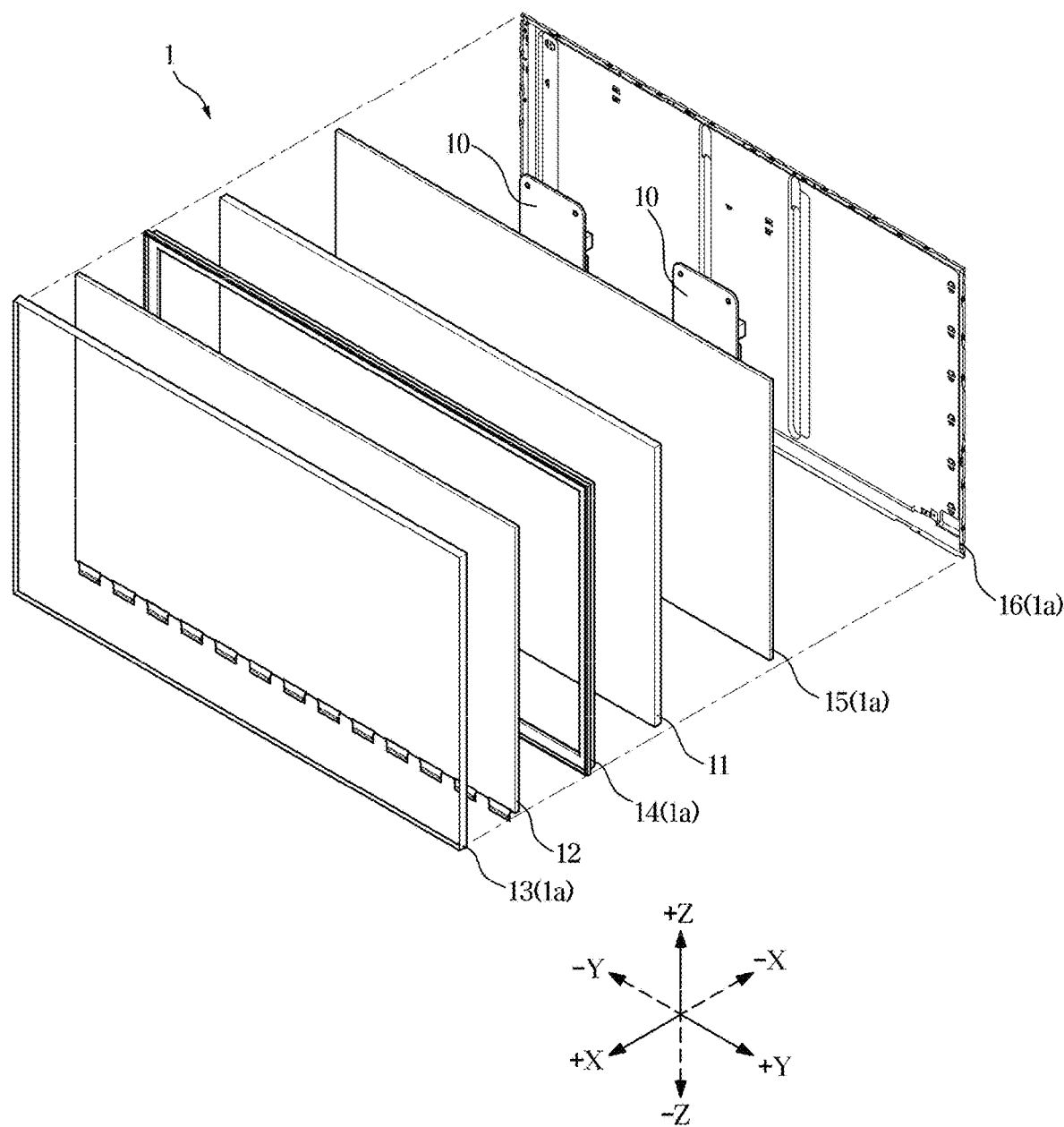
FIG. 1 is an exploded perspective view illustrating an example display apparatus according to various embodiments.

Configurations illustrated in the various example embodiments and the drawings described in the present disclosure are simply example embodiments of the disclosure, and thus it is to be understood that various modified examples, which may replace the embodiments and the drawings described in the present disclosure, are possible.

Like reference numerals or symbols denoted in the drawings of the present disclosure represent members or components that perform the same or substantially the same functions.

The terms used in the present disclosure are merely used to describe various example embodiments, and are not intended to restrict and/or limit the disclosure. It is to be understood that the singular forms "a," "an," and "the" include plural referents unless the context clearly dictates otherwise. It will be understood that when the terms "includes," "comprises," "including," and/or "comprising," when used in this disclosure, specify the presence of stated features, figures, steps, operations, components, members, or combinations thereof, but do not preclude the presence or addition of one or more other features, figures, steps, operations, components, members, or combinations thereof.

It will be understood that, although the terms including ordinal numbers, such as "first", "second", etc., may be used herein to describe various components, these components are not limited by these terms. These terms are simply used to distinguish one component from another. For example, a first component could be termed a second component, and, similarly, a second component could be termed a first component, without departing from the scope of the disclosure. As used herein, the term "and/or" includes any and all combinations of one or more of associated listed items.

In the following description, the terms "up-down direction", "upper", "lower", etc. are defined based on the drawings, and the shapes and positions of the corresponding components are not limited by the terms. For example, referring to FIG. 2, a longitudinal direction in which a supporter 100 extends may be defined as an up-down direction, and upper and lower sides may be defined based on the up-down direction. For example, a direction toward −X may be defined as an up direction, and a direction toward +X may be defined as a down direction. Also, a direction in which the supporter 100 is inserted may be defined as an up-down direction.

Hereinafter, various example embodiments of the disclosure will be described in greater detail with reference to the accompanying drawings.

Figure 2:
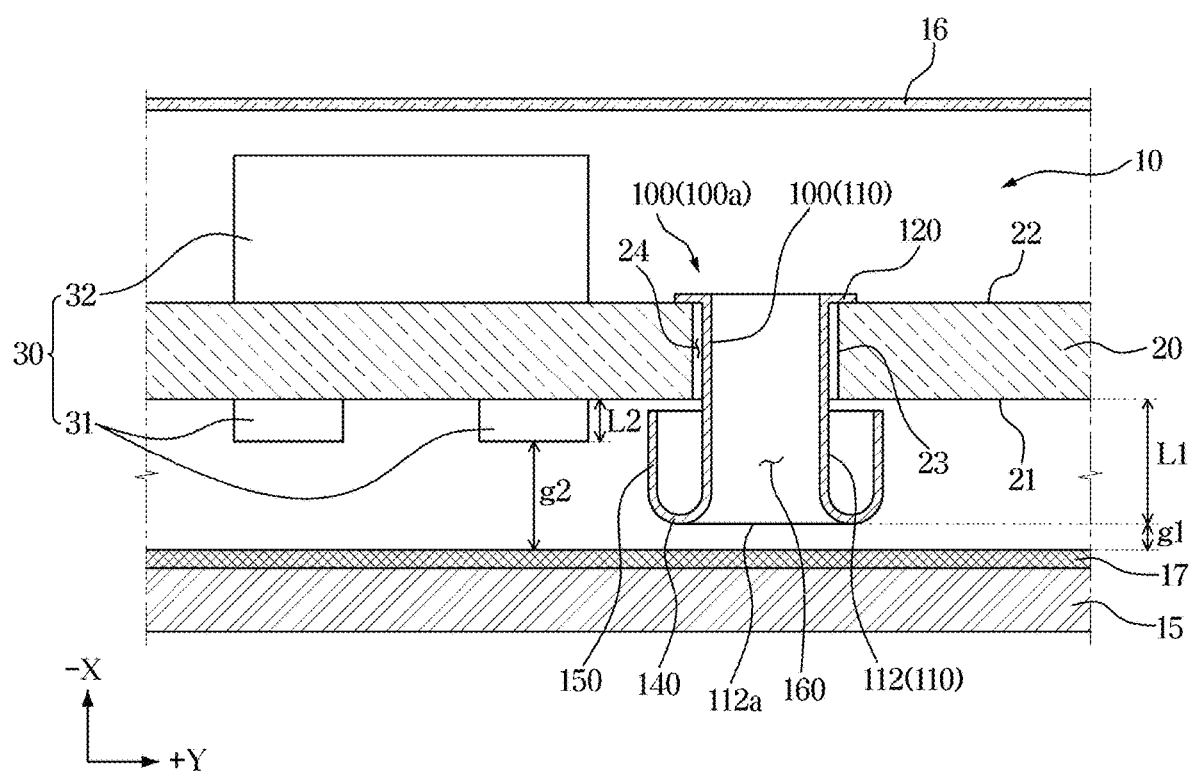
FIG. 2 is a cross-sectional view of a printed circuit board assembly shown in FIG. 1 according to various embodiments.
Figure 3:
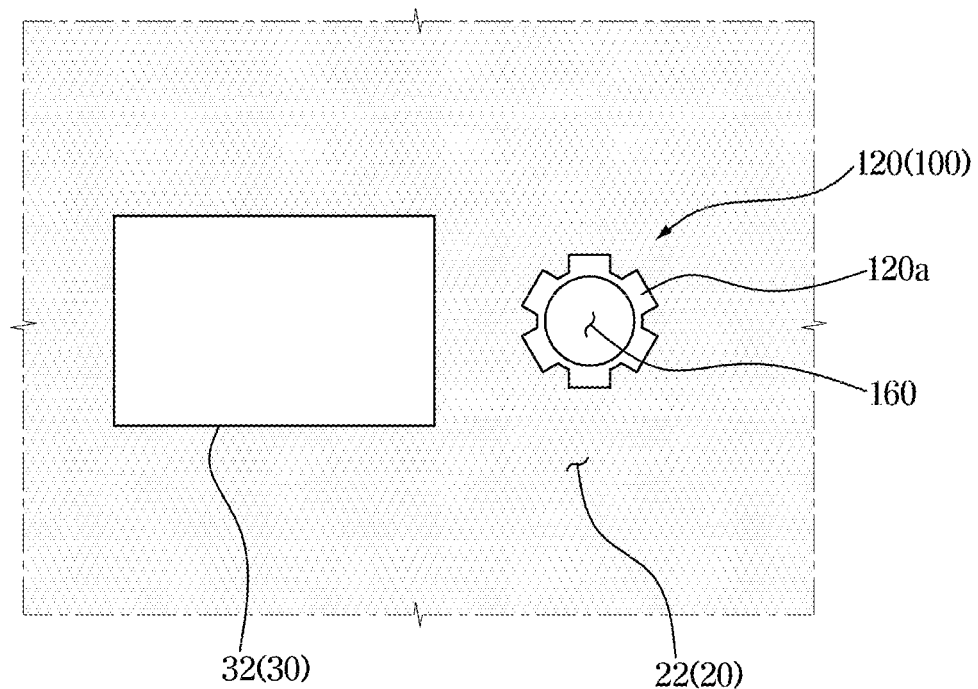
FIG. 3 is a top view of the printed circuit board assembly shown in FIG. 2 according to various embodiments.
Figure 4:
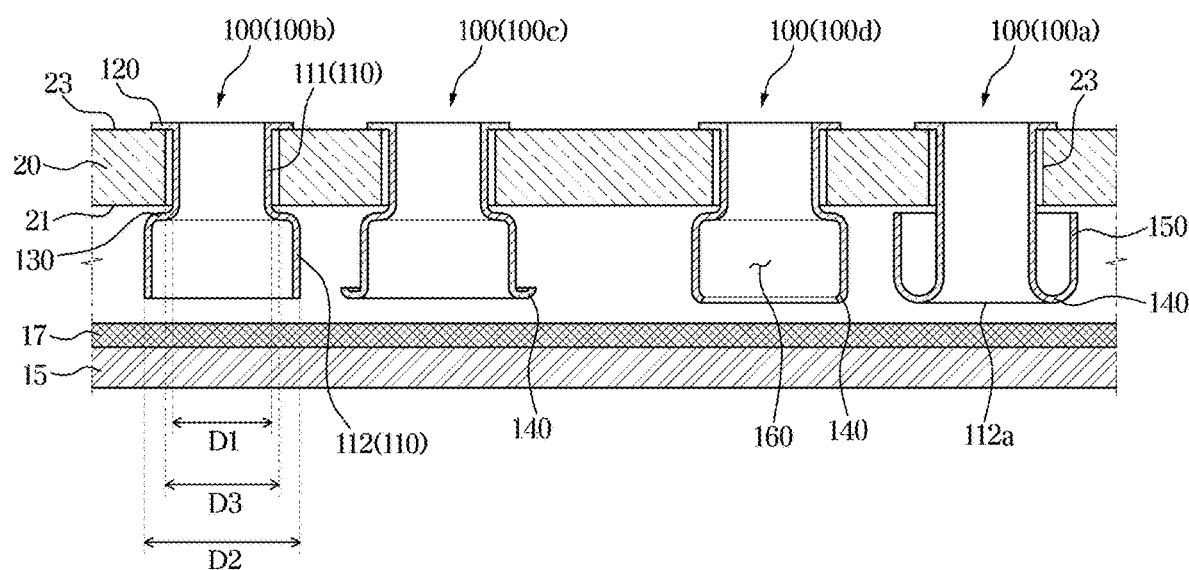
FIG. 4 is a partial cross-sectional view of a printed circuit board illustrating supporters according to various embodiments.
Figure 5:
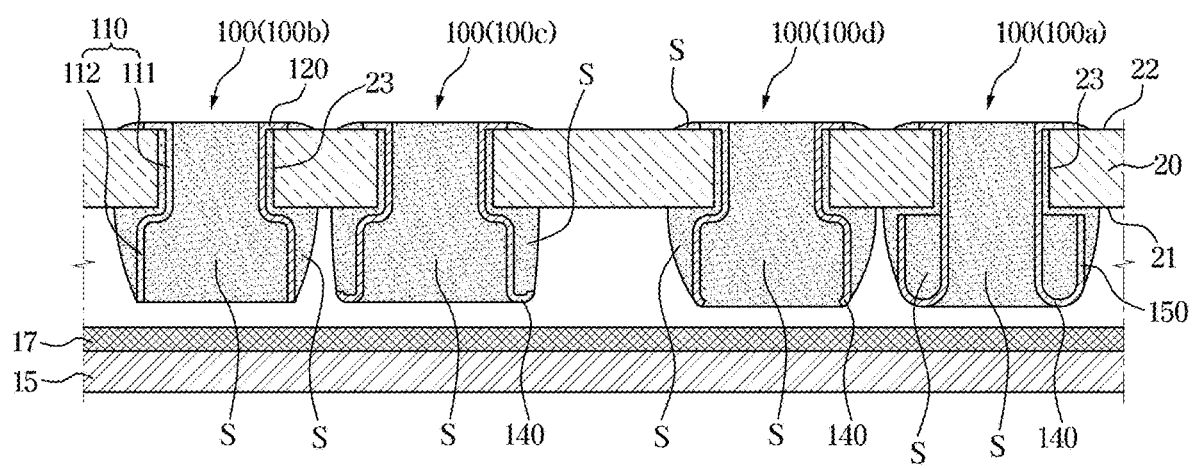
FIG. 5 is a partial cross-sectional view of a printed circuit board illustrating soldered states of the supporters shown in FIG. 4 according to various embodiments.
Figure 6:
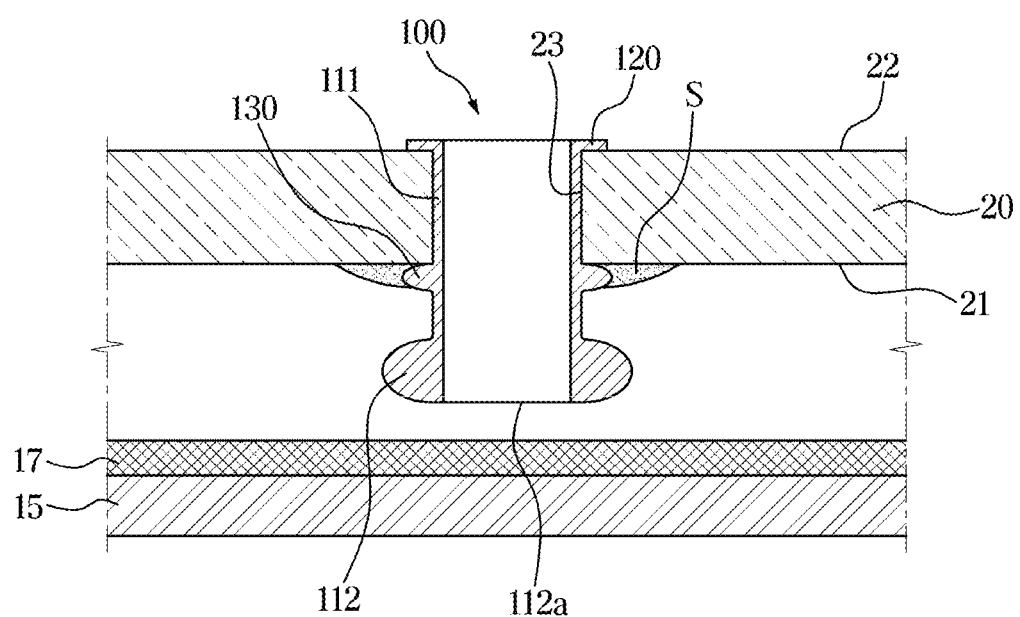
FIG. 6 is a cross-sectional view of a printed circuit board illustrating supporters according to various embodiments.
Figure 7:
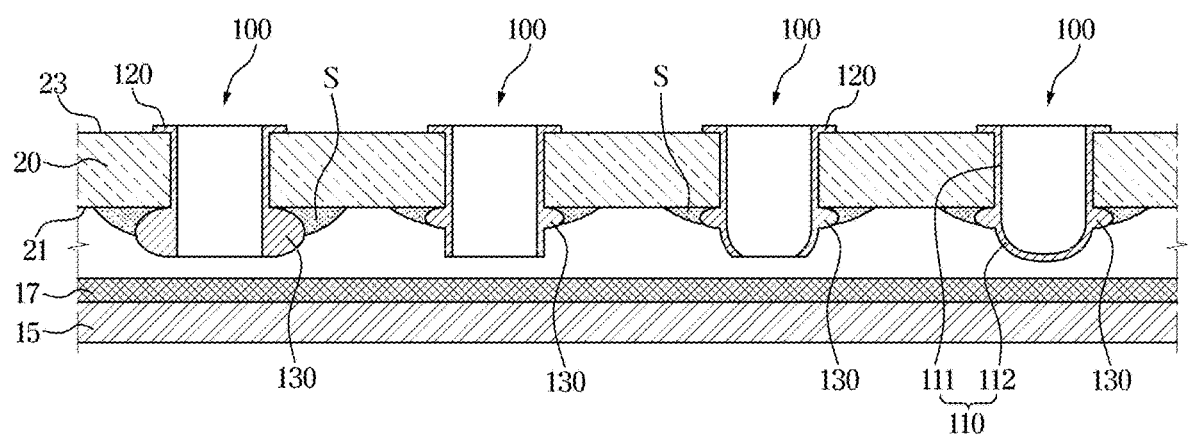
FIG. 7 is a cross-sectional view of a printed circuit board illustrating supporters according to various embodiments.

FIG. 1 is an exploded perspective view illustrating an example display apparatus according to various embodiments. FIG. 2 is a cross-sectional view of a printed circuit board assembly shown in FIG. 1 according to various embodiments. FIG. 3 is a top view of the printed circuit board assembly shown in FIG. 2 according to various embodiments. FIG. 4 is a cross-sectional view of the printed circuit board illustrating example supporters according to various embodiments. FIG. 5 is a cross-sectional view of the printed circuit board illustrating example soldered states of the supporters shown in FIG. 4 according to various embodiments. FIG. 6 is a cross-sectional view of a printed circuit board illustrating example supporters according to various embodiments. FIG. 7 is a cross-sectional view of a printed circuit board illustrating supporters according to various embodiments.

According to various embodiments of the disclosure, an electronic device 1 may include, for example, and without limitation, at least one of a display apparatus, a mobile communication terminal, a tablet Personal Computer (PC), a wearable electronic device, or the like. A display apparatus 1 will be described as an example of the electronic device 1, although the electronic device 1 is not limited thereto.

The display apparatus 1 may be an apparatus for processing an image signal received from outside, and visually displaying a processed image. Hereinafter, a case in which the display apparatus 1 is a television (TV) will be described by way of non-limiting example. However, the display apparatus 1 is not limited to a TV. For example, the display apparatus 1 may be implemented as various kinds, such as a monitor, a mobile multimedia device, a portable communication device, etc. However, the kind of the display apparatus 1 is not limited as long as it is capable of visually displaying images.

The display apparatus 1 may receive content data including video data and audio data from various content sources, and output video and audio corresponding to the video data and the audio data. For example, the display apparatus 1 may receive content data through a broadcast receiving antenna or a wired cable, receive content data from a contents playing apparatus, or receive content data from a content providing server of a content provider.

As shown in FIG. 1, the display apparatus 1 may include a main body 1a. The main body 1a may form an outer appearance. Inside the main body 1a, components for enabling the display apparatus 1 to display images or perform various functions may be provided. In FIG. 1, the main body 1a is shown to be in a shape of a flat plate. However, the shape of the main body 1a is not limited to a flat plate. For example, the main body 1a may be in a shape of a bent plate. The main body 1a may have a bendable or flexible shape. That is, the main body 1a may have various shapes.

In the main body 1a, a light source device 11 and a display panel 12 may be provided.

The light source device 11 may provide light to the display panel 12. For example, the light source device 11 may include a light source module for generating light, a reflective sheet for reflecting light, a diffuser plate for uniformly diffusing light, an optical sheet for improving brightness of emitting light, etc., which are not shown in the drawings.

In the display panel 12, a screen may be provided. The display panel 12 may display various images on the screen according to image signals received from outside. The display panel 12 may block, reflect, and/or transmit light emitted from the light source device 11, although not limited thereto. For example, a plurality of pixels of the display panel 12 may generate light, and thereby, the display panel 12 may generate an image.

For example, the display panel 12 may include a thin film transistor substrate in which thin film transistors are formed in a matrix form, a color filter substrate coupled in parallel with the thin film transistor substrate, and liquid crystal injected between the thin film transistor substrate and the color filter substrate, wherein optical properties of the liquid crystal change according to a change of a voltage or temperature, which are not shown in the drawings.

In the main body 1a, at least one printed circuit board assembly 10 may be provided. The printed circuit board assembly 10 may supply power to the display apparatus 1. For example, the printed circuit board assembly 10 may include at least one of a power board or a LED driver. The printed circuit board assembly 10 may be a power driver board into which a power board and a LED driver are integrated.

The main body 1a may support components of the display apparatus 1. For example, the main body 1a may support at least one of the light source device 11, the display panel 12, or the printed circuit board assembly 10. The main body 1a may include at least one chassis, and may be configured as a chassis assembly. For example, the main body 1a may include a bezel 13, a middle mold 14, a bottom chassis 15, and a rear cover 16, although not limited thereto. For example, the main body 1a may be an integrated housing.

As shown in FIG. 2, the bottom chassis 15 may include an insulating sheet 17. The insulating sheet 17 may be positioned on at least one portion of one side of the bottom chassis 15. The insulating sheet 17 may be stacked on one side of the bottom chassis 15. The insulating sheet 17 may prevent and/or reduce electricity generated in a printed circuit board (PCB) 20 which will be described in greater detail below from being transmitted through the main body 1a.

Hereinafter, an example in which the printed circuit board assembly 10 is positioned between the bottom chassis 15 and the rear cover 16 will be described. However, this is merely an example of the disclosure, and a location of the printed circuit board assembly 10 is not limited to this.

Referring to FIG. 2, the printed circuit board assembly 10 may include the printed circuit board 20. The printed circuit board 20 may include metal wires thereinside, and various electronic components 30, etc. may be mounted on the printed circuit board 20 according to their purposes. For example, by mounting circuit devices on the printed circuit board 20, the printed circuit board 20 may configure a circuit. For example, and without limitation, the printed circuit board 20 may be provided by forming wirings with a copper foil on a base which is a thin substrate made of an insulator such as an epoxy resin or a bakelite resin and then printing a lead resist thereon.

The printed circuit board 20 may include a first surface 21 and a second surface 22 that is opposite to the first surface 21. For example, in FIG. 2, the first surface 21 may be a bottom surface of the printed circuit board 20, and the second surface 22 may be a top surface of the printed circuit board 20. The second surface 22 may be a mounting surface on which the electronic components 30, etc. are mounted. The first surface 21 may be a reverse surface which is opposite to the mounting surface. The first surface 21 may face the bottom chassis 15. The second surface 22 may face the rear cover 16. However, positions of the first surface 21 and the second surface 22 are an example of FIG. 2, and the positions of the first surface 21 and the second surface 22 are not limited to these.

The printed circuit board 20 may include a through hole 23. The through hole 23 may penetrate the first surface 21 and the second surface 22. A plurality of through holes 23 may be provided in such a way as to be spaced from each other.

The printed circuit board 20 may include a plurality of circuit patterns, which are not shown in the drawings. The printed circuit board 20 is shown to be a single layer. However, the printed circuit board 20 may be provided as a multi-layer.

At least one electronic component 30 may be mounted on the printed circuit board 20. For example, the electronic component 30 may include a bottom component 31 positioned on the first surface 21 of the printed circuit board 20, and a top component 32 positioned on the second surface 22 of the printed circuit board 20. The electronic component 30 may include a lead 33 (refer to FIGS. 8, 9, 10, 11 and 13). For example, the electronic component 30 may be inserted in the printed circuit board 20 by Insert Mount Technology (IMT), or mounted on the printed circuit board 20 by Surface Mount Technology (SMT), although not limited thereto. However, the electronic component 30 may be mounted on the printed circuit board 20 by various methods.

Referring to FIGS. 2, 3, 4 and 5, the supporter 100 may support the printed circuit board 20. The supporter 100 may distribute an impact, etc. applied to the printed circuit board assembly 10. For example, the display apparatus 1 may need to pass a 62369-1 Impact test which refers to a CB/UL integrated specification. The display apparatus 1 may pass the 62369-1 Impact test in a case in which a thickness of the insulating sheet 17 is maintained at 0.4 T or more even after an impact is applied to the display apparatus 1 by dropping a steel ball of 500 g at 1.3 m onto the display apparatus 1. However, according to the slimming trend of display apparatuses, the electronic component 30 may damage the insulating sheet 17 due to an impact, etc. from the outside. For example, a problem that the insulating sheet 17 is scratched or penetrated by the electronic component 30 may be generated. The supporter 100 may improve a specification-related issue as described above.

The supporter 100 may be installed in the printed circuit board 20. For example, the supporter 100 may be inserted in the through hole 23. For example, the supporter 100 may be inserted in the through hole 23 of the printed circuit board 20 from the first surface 21 of the printed circuit board 20 in, for example, an Auto Insert process.

The supporter 100 may include a body 110 and a head 120.

The body 110 may include a first body 111 positioned inside the through hole 23. The first body 111 may extend from the head 120 toward the bottom chassis 15. The first body 111 may be substantially in a shape of a cylinder. The first body 111 may correspond to the through hole 23. A width of the first body 111 may be smaller than that of the through hole 23. A diameter D1 of the first body 111 may be smaller than a diameter D3 of the through hole 23. A preset space 24 may be formed between an outer circumference surface of the first body 111 and the through hole 23.

The body 110 may include a second body 112 extending from the first body 111. The second body 112 may extend from the first body 111 toward the bottom chassis 15. The second body 112 may extend from the first body 111 away from the first surface 21 of the printed circuit board 20. The second body 112 may be located outside the through hole 23. The second body 112 may protrude toward the bottom chassis 15 from the through hole 23 of the printed circuit board 20 to prevent and/or reduce the electronic component 30 (particularly, the lead 33) mounted on the printed circuit board 20 from interfering with the bottom chassis 15.

The second body 112 may be spaced from the bottom chassis 15. The second body 112 may be spaced from the insulating sheet 17 provided on the bottom chassis 15. For example, the second body 112 may communicate with the first body 111. The second body 112 may include an opening 112*a*. A solder S may enter an internal space 160 of the supporter 100 through the opening 112*a*.

Upon inserting of the supporter 100 into the through hole 23 from the first surface 21 of the printed circuit board 20, the second body 112 may be caught by the printed circuit board 20. For example, upon inserting of the supporter 100 into the through hole 23 from the first surface 21, the second body 112 may prevent and/or block the supporter 100 from escaping from the printed circuit board 20 through the through hole 23. A width of the second body 112 may be greater than that of the through hole 23. A diameter D2 of the second body 112 may be greater than the diameter D3 of the through hole 23. The second body 112 may not pass through the through hole 23.

Referring to FIGS. 4 and 5, the width of the second body 112 may be greater than that of the first body 111. The diameter D2 of the second body 112 may be greater than the diameter D1 of the first body 111. Accordingly, a step may be made between the first body 111 and the second body 112, and the second body 112 may be caught by the first surface 21 of the printed circuit board 20.

Referring to FIGS. 4, 5, 6 and 7, the second body 112 may include a projection 130. The projection 130 may be caught by the first surface 21 upon inserting of the supporter 100 into the through hole 23 from the first surface 21. A width of the projection 130 may be greater than that of the first body 111. A diameter of the projection 130 may be greater than that of the first body 111. A width of the projection 130 may be greater than that of the through hole 23. The diameter of the projection 130 may be greater than that of the through hole 23. Accordingly, the projection 130 may not pass through the through hole 23.

In supporters 100*b*, 100*c*, and 100*d* shown in FIGS. 4 and 5, the projection 130 may be substantially in a shape of a step. As shown in FIGS. 6 and 7, the projection 130 may protrude in an outer radial direction of the second body 112, and extend along a circumference of the second body 112. However, the shape of the projection 130 is not limited to this, and the projection 130 may have any shape that is capable of being caught by the first surface 21 of the printed circuit board 20.

A height of the supporter 100 may be adjusted according to a length L1 of the second body 112. A separation distance g1 between the supporter 100 and the insulating sheet 17 may be adjusted according to the length L1 of the second body 112. Accordingly, the height of the supporter 100 may be easily managed by adjusting the length L1 of the second body 112. For example, a worker may design the length L1 of the second body 112 by considering a length L2 of the bottom component 21, a position of the bottom chassis 15, etc. In other words, a worker may easily design the height of the supporter 100.

In the supporters 100a, 100c, and 100d shown in FIGS. 4 and 5, the second body 112 of the supporter 100 may be bent. For example, the second body 112 may include a bent portion 140 being adjacent to the bottom chassis 15. For example, the bent portion 140 may be bent inward (see the supporter 100d) or outward (see the supporter 100c) from an end of the second body 112.

The bent portion 140 may prevent and/or reduce the printed circuit board assembly 10 from damaging the insulating sheet 17 upon generation of vibrations, shaking, etc. of the printed circuit board assembly 10 due to an impact. For example, the bent portion 140 may include a curved shape, and may be prevented from or may avoid scratching or penetrating the insulating sheet 17 despite friction with the insulating sheet 17.

Referring to the supporter 100a shown in FIGS. 2, 4, and 5, the second body 112 of the supporter 100 may further include an extension portion 150 extending from the bent portion 140 toward the first surface 21 of the printed circuit board 20. The extension portion 150 may support the first surface 21 of the printed circuit board 20. The extension portion 150 may be caught by the first surface 21 upon inserting of the supporter 100 into the through hole 23 from the first surface 21 of the printed circuit board 20. For example, the extension portion 150 may prevent and/or block the supporter 100 from escaping from the printed circuit board 20 through the through hole 23 upon inserting of the supporter 100 into the through hole 23 from the first surface 21. For example, the extension portion 150 may function as the projection 130. In this case, a width of the extension portion 150 may be greater than that of the through hole 23. A diameter of the extension portion 150 may be greater than the diameter D3 of the through hole 23. Accordingly, the extension portion 150 may not pass through the through hole 23.

The supporter 100 may include a head 120 that is fixed on the second surface 22 of the printed circuit board 20. The head 120 may be fixed on the mounting surface 22. The head 120 may be fixed on the top surface 22 as shown in FIG. 2.

The head 120 may be a portion extending from the first body 111 and protruding from the through hole 23 with respect to the second surface 22. The head 120 may be clinched and fixed on the second surface 22. For example, the head 120 may include a plurality of incision pieces 120a (refer to FIG. 3) formed by being incised in all directions. The plurality of incision pieces 120a may be bent in an outer radial direction and bonded on the second surface 22. The head 120 may also be referred to as a clinch head 120.

The head 120 may be clinched in an Auto Insert process. For example, upon automatically inserting of the supporter 100 into the through hole 23 toward the second surface 22 from the first surface 21 of the printed circuit board 20, the second body 112 having the greater width than that of the through hole 23 may be caught by the first surface 21. In this case, a portion protruding from the second surface 22 through the through hole 23 of the supporter 100 may include a plurality of incision pieces 120a formed by being incised in all directions. The plurality of incision pieces 120a may be bent in an outer radial direction and fixed on the second surface 22.

Referring to FIG. 2, the length L1 of the second body 112 of the supporter 100 may be longer than the length L2 of the bottom component 31. That is, the second body 112 of the supporter 100 may protrude in a down direction (+X direction) more than the bottom component 31 with respect to the first surface 21. Accordingly, the supporter 100 may prevent and/or avoid the bottom component 31 from damaging other components or being damaged by the other components. The supporter 100 may optimize the length L2 of the bottom component 31. For example, the length L2 of the bottom component 31 may be adjusted within the length L1 of the second body 112.

Referring to FIG. 2, a separation distance g1 between the second body 112 and the insulating sheet 17 may be shorter than a separation distance g2 between the bottom component 31 and the insulating sheet 17.

The supporter 100 may include an eyelet. For example, the supporter 100 may be manufactured with an existing eyelet component. Because an eyelet component is assembled in an Auto Insert process, the supporter 100 may also be installed in the printed circuit board 20 in the Auto Insert process. Accordingly, a worker's task of inserting a supporter into a printed circuit board and then bonding the supporter may be omitted unlike a manual insert supporter. Using an existing eyelet component, unlike a SMD supporter, cost may be effectively reduced. As a result, productivity of the display apparatus 1 may be improved.

Referring to FIG. 4, the supporter 100 may support the printed circuit board 20 without separate soldering because the head 120 is clinched on the second surface 22. For example, the supporter 100 may relieve an impact, etc. applied onto the printed circuit board 20 without separate soldering.

As shown in FIGS. 5 and 7, to reinforce fixation power, separate soldering may be performed after the supporter 100 is fixed in the through hole 23. For example, the second body 112 may be soldered on the first surface 21, and the head 120 may be soldered on the second surface 22. The solder S may be soldered to fill the inner space 160 of the supporter 100. The solder S may be soldered to fill the space 24 (refer to FIG. 2) between the outer circumference surface of the first body 111 and the through hole 23. However, the solder S shown in the drawings is an example, and a shape and location of the solder S are not limited to these.

Figure 8:
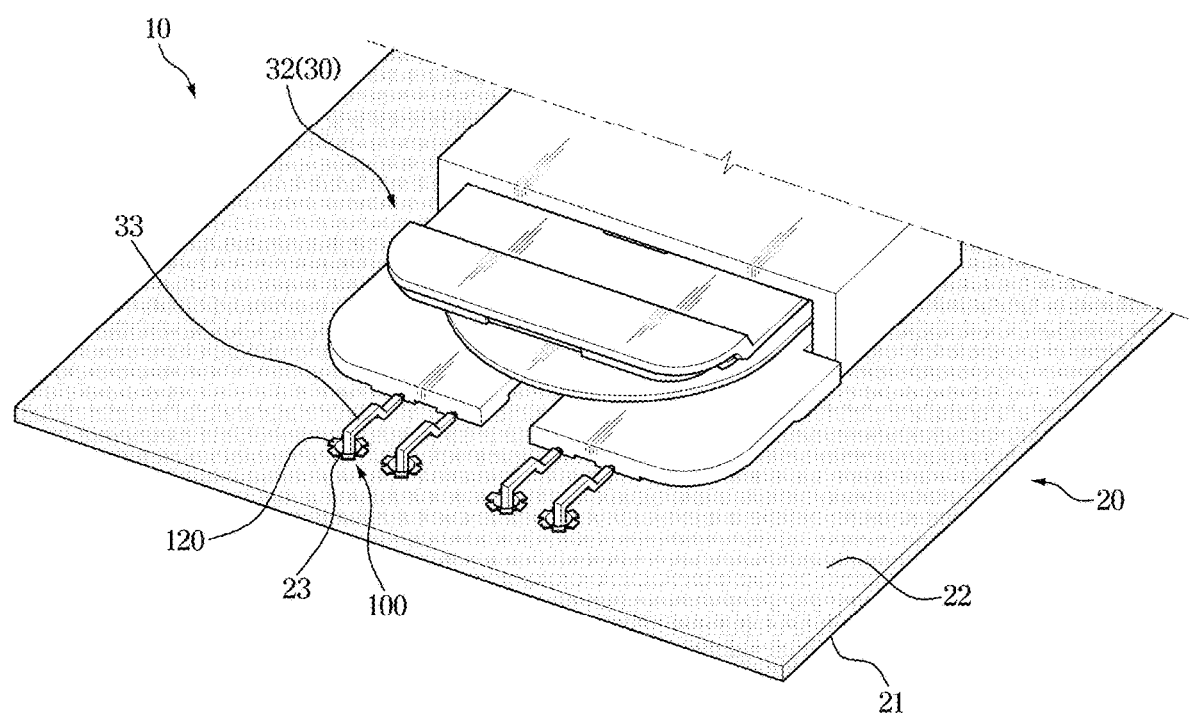
FIG. 8 is a partial perspective view illustrating a printed circuit board assembly to which supporters for performing an eyelet function are applied according to various embodiments.
Figure 9:
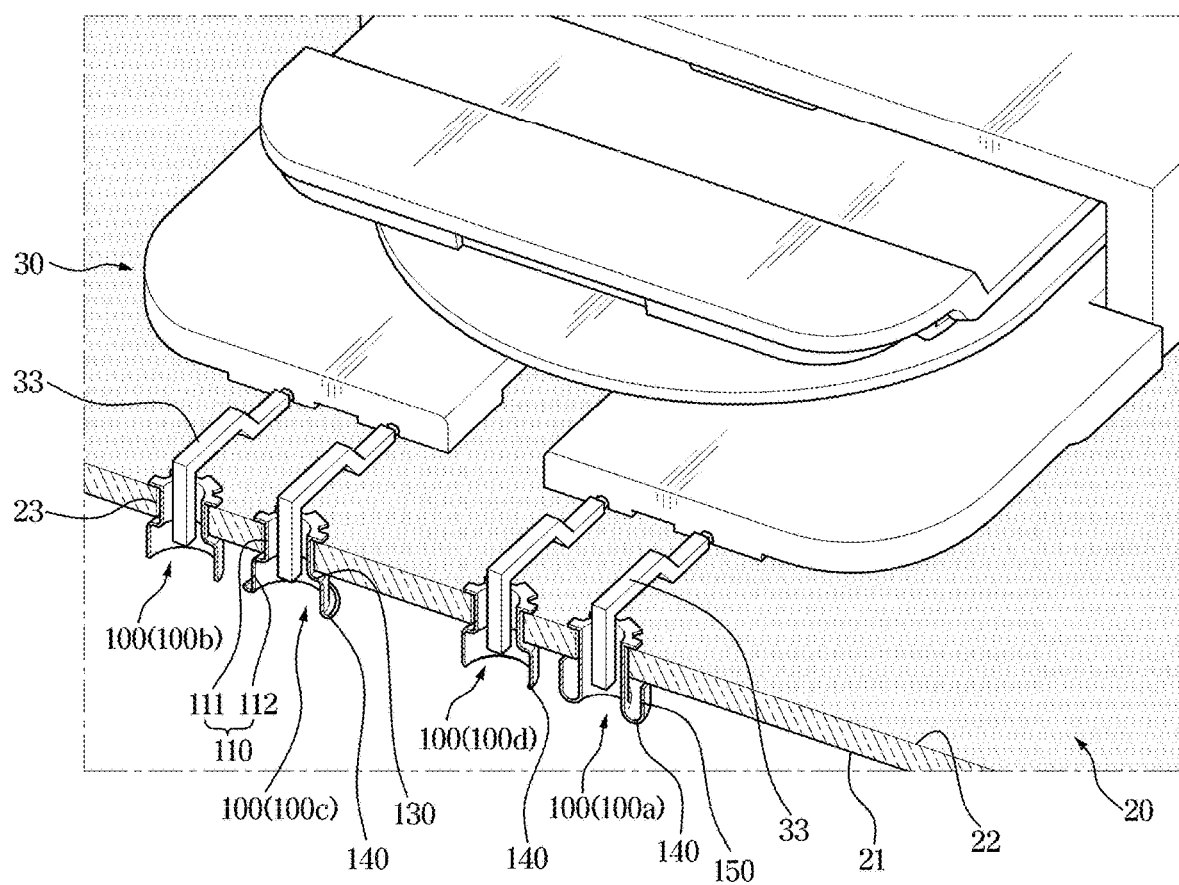
FIG. 9 is a partial sectional perspective view of the printed circuit board assembly shown in FIG. 8 after a portion of the printed circuit board assembly is cut according to various embodiments.
Figure 10:
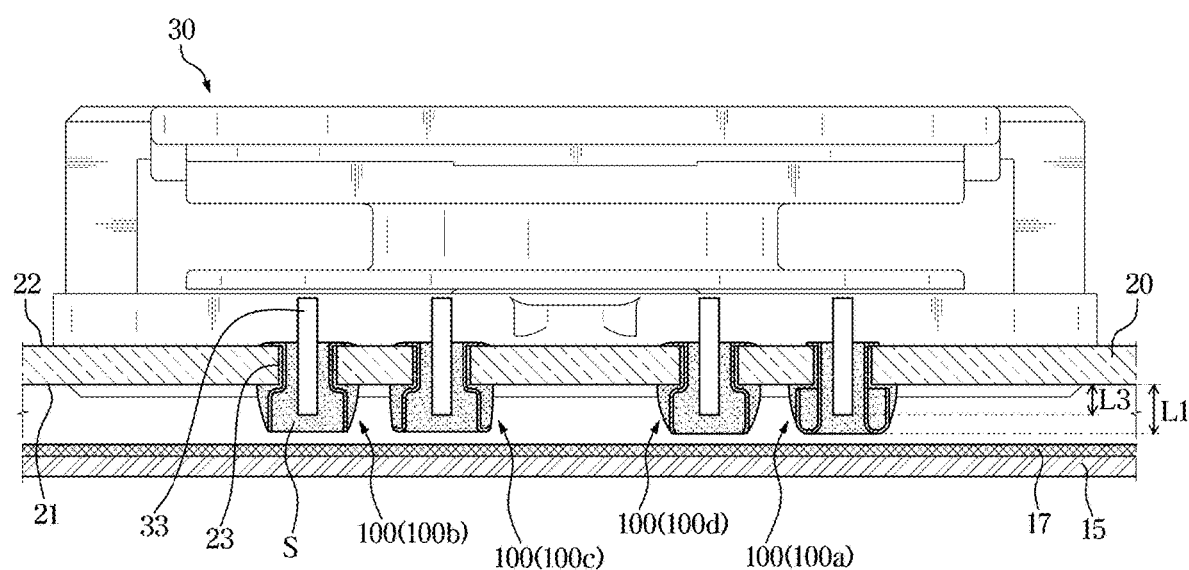
FIG. 10 is a cross-sectional view of the printed circuit board assembly shown in FIG. 8 according to various embodiments.
Figure 11:
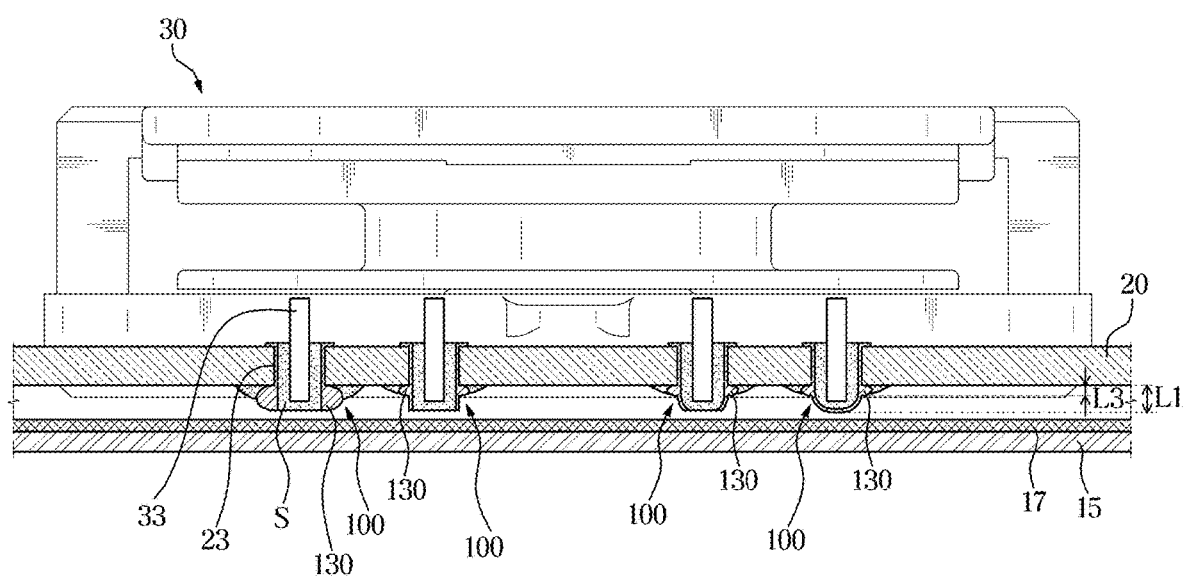
FIG. 11 is a cross-sectional view of the printed circuit board assembly illustrating supporters for performing an eyelet function according to various embodiments.
Figure 12:
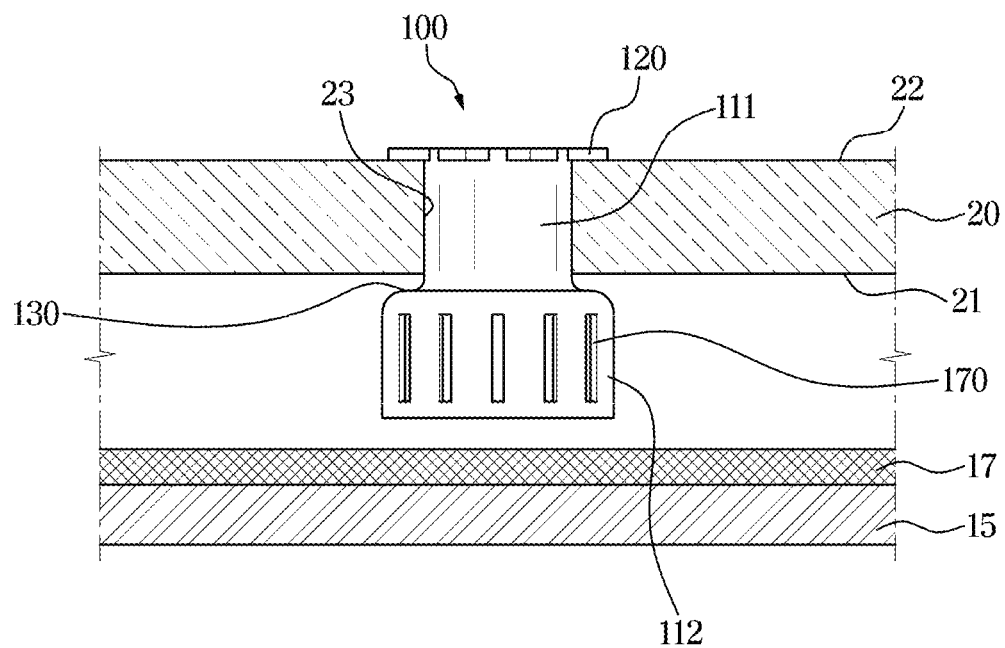
FIG. 12 is a cross-sectional view of a printed circuit board illustrating a supporter including a solder reinforcement hole according to various embodiments.
Figure 13:
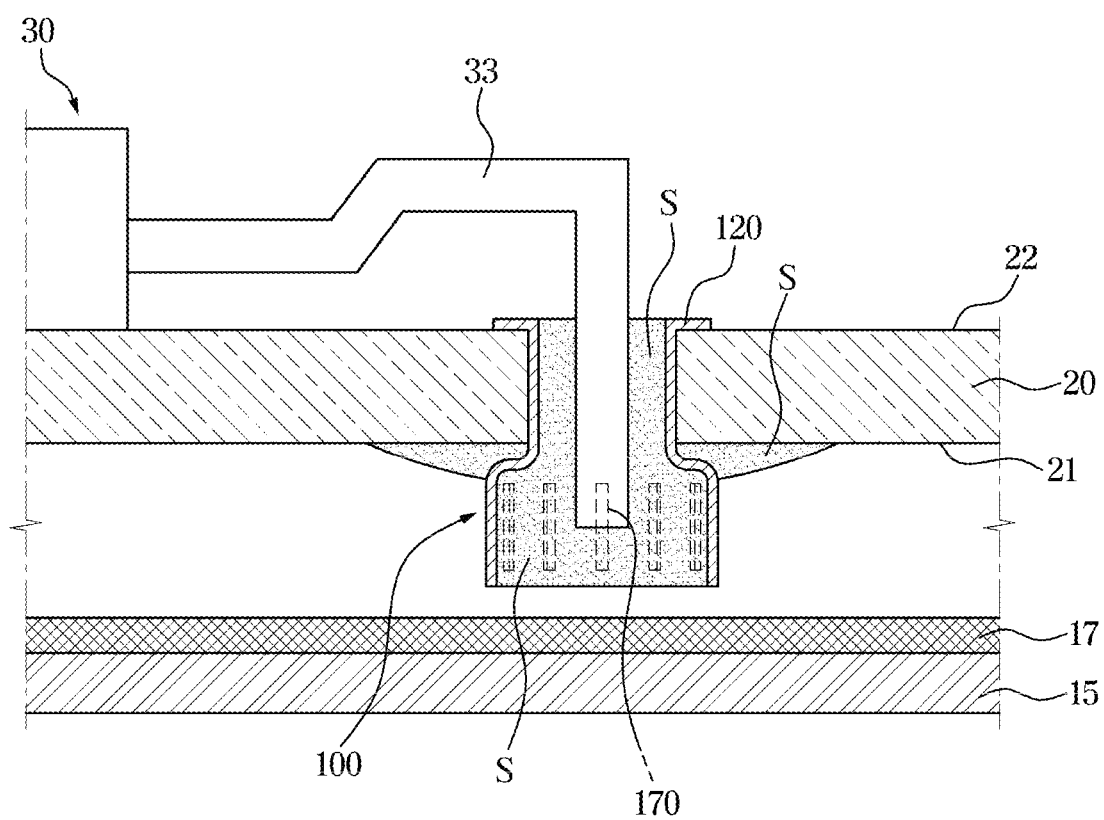
FIG. 13 is a cross-sectional view of a printed circuit board assembly to which the supporter shown in FIG. 12 is applied according to various embodiments.

FIG. 8 is a partial perspective view illustrating a printed circuit board assembly to which supporters for performing an eyelet function are applied according to various embodiments. FIG. 9 is a partial perspective sectional view illustrating the printed circuit board assembly shown in FIG. 8 after a portion of the printed circuit board assembly is cut according to various embodiments. FIG. 10 is a cross-sectional view of the printed circuit board assembly shown in FIG. 8 according to various embodiments. FIG. 11 is a cross-sectional view illustrating supporters for performing an eyelet function according to various embodiments. FIG. 12 is a cross-sectional view illustrating a supporter including a solder reinforcement hole according to various embodiments. FIG. 13 is a cross-sectional view illustrating a printed circuit board assembly to which the supporter shown in FIG. 12 is applied according to various embodiments. Content overlapping with that described above may not be repeated here.

Referring to FIG. 8, the supporter 100 may perform an eyelet function in addition to a function of a PCB supporter supporting the printed circuit board 20. For example, the supporter 100 may fix the lead 33 of the electronic component 30. The supporter 100 may be applied to a portion in which overweight, a high voltage, or an overcurrent is generated, thereby improving PL-type defects (for example, heating, an electrical shock, etc.).

The lead 33 may be located inside the supporter 100. For example, the lead 33 may be positioned in the internal space of the supporter 100. The lead 33 may be fixed in the supporter 100 by soldering. A solder S may be filled in the internal space 160 of the supporter 100 in a state in which the lead 33 is positioned inside the supporter 100. A molten solder S may be filled in the internal space 160 and then hardened, and accordingly, the lead 33 may be stably bonded with the supporter 100. For example, the solder S may enter the internal space 160 through the opening 120a of the second body 120.

For example, the second body 112 may be soldered on the first surface 21, the head 120 may be soldered on the second surface 22, and the space 24 between the outer circumference surface of the body 111 and the through hole 23 may be soldered.

The length L1 of the second body 112 of the supporter 100 may be longer than a length L3 of the lead 33. For example, the length L1 of the second body 112 of the supporter 100 may protrude in a down direction (+X direction) more than the lead 33 with respect to the first surface 21. Accordingly, the supporter 100 may prevent and/or reduce the lead 33 from damaging other components or being damaged by the other components. For example, a problem in which the lead 33 presses the insulating sheet 17 by an impact, vibrations, etc. applied from the outside to scratch or penetrate the insulating sheet 17 may be prevented or avoided. A problem in which the lead 33 is damaged by a friction with other components to cause connecting errors may be prevented or avoided.

The supporter 100 may optimize the length L3 of the lead 33. For example, the length L3 of the lead 33 may be adjusted within the length L2 of the second body 121, and accordingly, the length L3 of the lead 33 may be easily managed.

As shown in FIGS. 12 and 13, the supporter 100 may include a solder reinforcement hole 170. A plurality of solder reinforcement holes 170 may be arranged along a circumferential direction of the supporter 100. The solder reinforcement hole 170 may enable the solder S to more smoothly enter the internal space 160 of the supporter 100.

A worker may check a soldering task with his/her naked eyes through the solder reinforcement hole 170. While the solder S is filled in the internal space 16 of the supporter 100, the worker may determine a degree of soldering with his/her naked eyes through the solder reinforcement hole 170. That is, the worker may check the solder S being filled from the opening 112a of the second body 112 up to the head 120. Accordingly, a problem in which a subsequent process is performed after inadequate soldering may be avoided. Also, by adjusting a size of the solder reinforcement hole 170, a speed of soldering may be adjusted. As a result, because the supporter 100 includes the solder reinforcement hole 170, solderability may be improved.

Figure 14:
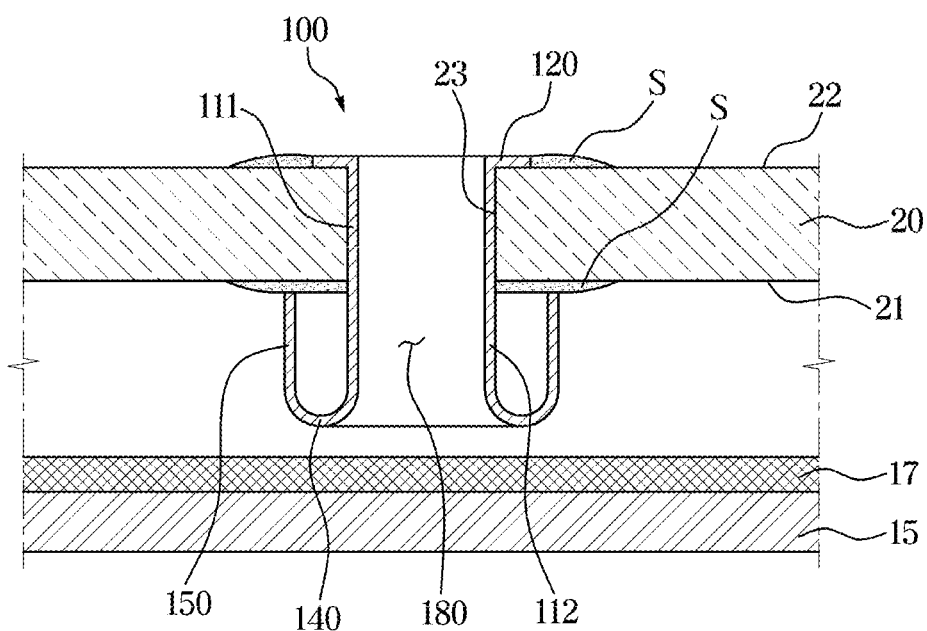
FIG. 14 is a cross-sectional view of a printed circuit board assembly to which a supporter used as a via component is applied according to various embodiments.

FIG. 14 is a cross-sectional view illustrating a printed circuit board assembly to which a supporter used as a via component is applied according to various embodiments. Content overlapping with that described above may not be repeated here.

Referring to FIG. 14, the supporter 100 may be used as a via component. The head 120 may be soldered on the second surface 22, and the second body 112 may be soldered on the first surface 21. For example, the supporter 100 may be bonded with the surfaces 21 and 22 of the printed circuit board 20 through, for example, a cream solder. A via hole 180 may be formed inside the supporter 100. For example, the internal space 160 of the supporter 100 may be formed as the via hole 180. The electronic component 30, etc. may be not inserted in the via hole 180. The via hole 180 may enable connections between multiple layers of the printed circuit board 20. The via hole 180 may reinforce a ground GND, and remove noise.

The supporter 100 according to various embodiments of the disclosure may perform complex functions. The supporter 100 may perform various functions according to a position of the supporter 100, coupling between the electronic components 30, etc. The supporter 100 may perform a PCB supporter function for distributing an impact applied on the printed circuit board 20. The supporter 100 may perform an eyelet function for fixing the lead 33. For example, the supporter 100 may be applied to a portion in which overweight, a high voltage, or an overcurrent is generated, thereby improving PL-type defects. The supporter 100 may perform a via component function. For example, the supporter 100 may form the via hole 180 therein to connect the first surface 21 of the printed circuit board 20 with the second surface 22 of the printed circuit board 20, or allow connections between multiple layers.

A method for manufacturing the display apparatus 1 will be described in greater detail below. For example, a process in which the supporter 100 is inserted and fixed in the printed circuit board 20 during an auto insert process will be described.

The printed circuit board 20 may be prepared. The printed circuit board 20 may include the mounting surface 22 on which the electronic component 30 is mounted, the reverse surface 21 that is opposite to the mounting surface 22, and the through hole 23 penetrating the mounting surface 22 and the reverse surface 21.

The supporter 100 may be inserted in the through hole 23 from the reverse surface 21 of the printed circuit board 20. Upon inserting of the supporter 100 into the through hole 23 from the reverse surface 21, the second body 112 of the supporter 100 may be caught by the reverse surface 21. Accordingly, the second body 112 may not penetrate the through hole 23 and may protrude with respect to the reverse surface 21. A portion protruding from the mounting surface 22 of the supporter 100 may be clinched and fixed on the mounting surface 22. Thereby, the clinch head 120 may be formed. The above-described process may be successively performed in the auto insert process, and accordingly, productivity may be raised.

The printed circuit board 20 (e.g., the printed circuit board assembly 10) in which the supporter 100 is inserted may be installed in the bottom chassis 15. For example, the second body 112 of the supporter 100 may be located between the reverse surface 21 of the printed circuit board 20 and the bottom chassis 15.

Figure 15:
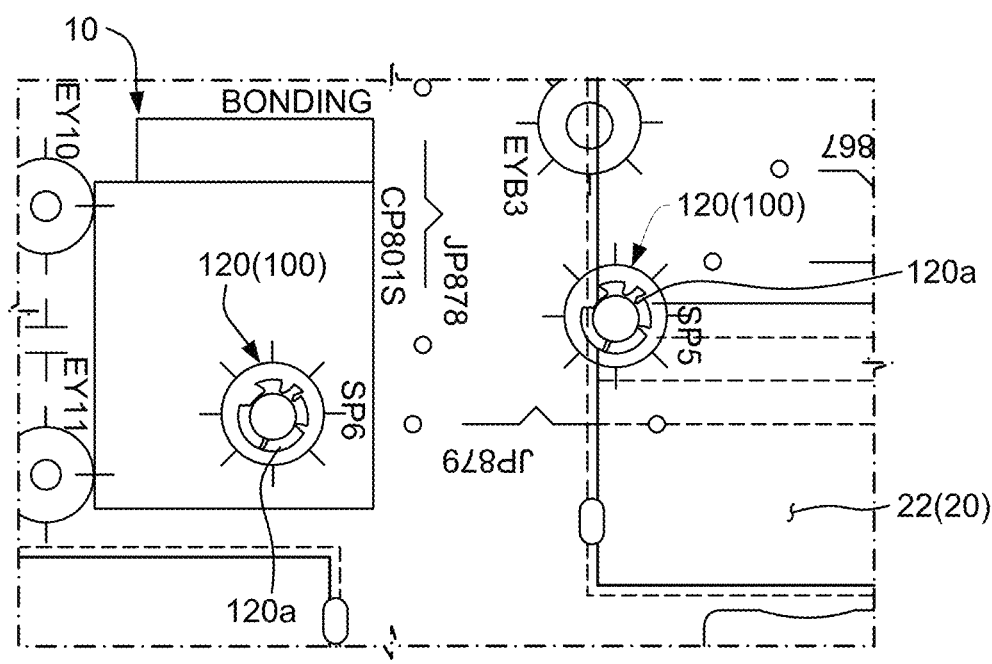
FIG. 15 is a top view of a printed circuit board showing a state in which a supporter is inserted in the printed circuit board according to various embodiments.
Figure 16:
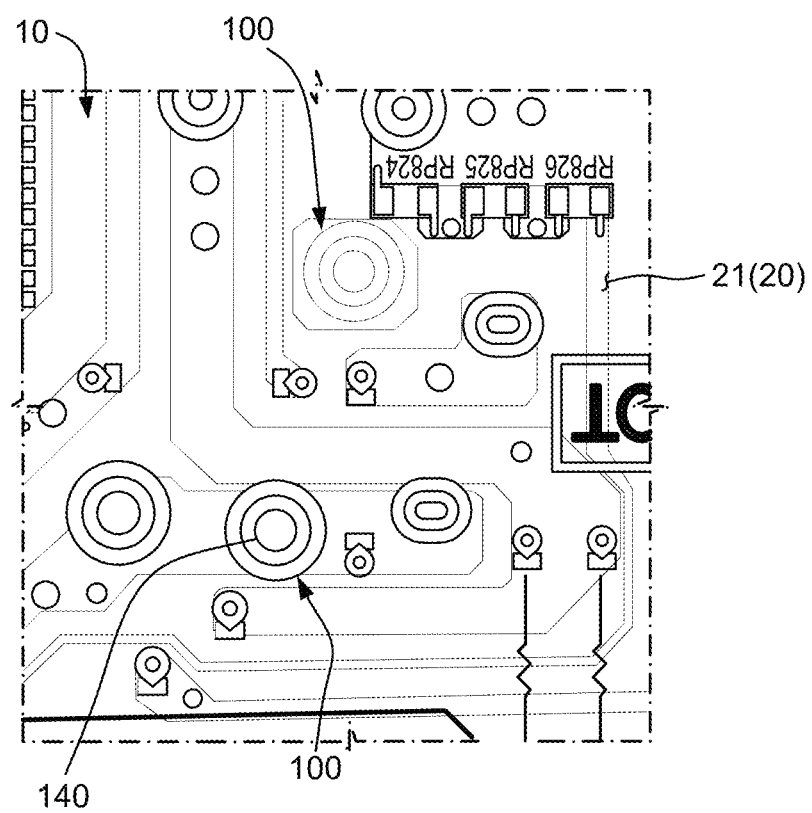
FIG. 16 is a bottom view of a printed circuit board showing a state in which a supporter is inserted in the printed circuit board according to various embodiments.
Figure 17:
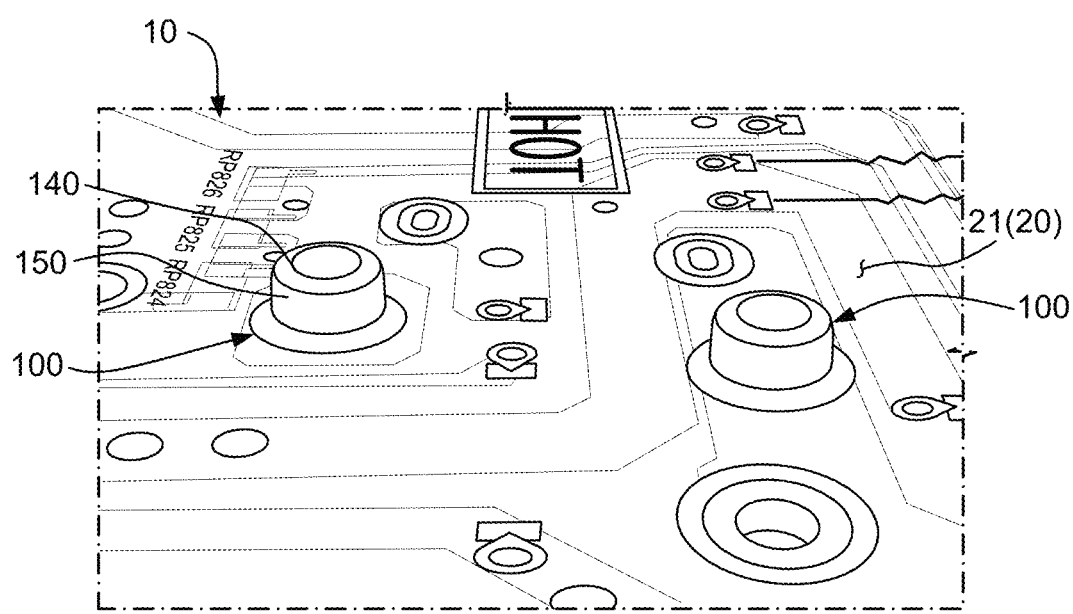
FIG. 17 is a bottom perspective view of a printed circuit board in which a supporter is inserted according to various embodiments.

FIGS. 15, 16 and 17 are top, bottom and perspective views, respectively, illustrating an example of a printed circuit board showing a state in which a supporter is inserted in the printed circuit board according to various embodiments.

According to an example embodiment, the display apparatus including the supporter capable of protecting electronic components and preventing and/or reducing the insulating sheet from being scratched may be provided.

According to an example embodiment of the disclosure, the display apparatus including the supporter capable of fixing leads of components may be provided.

According to an example embodiment of the disclosure, the display apparatus including the supporter capable of forming the via hole may be provided.

According to an example embodiment of the disclosure, the display apparatus manufacturing method for reducing cost and reducing the number of manufacturing processes may be provided.

While the disclosure has been illustrated and described with reference to various example embodiments, it will be understood that the various example embodiments are intended to be illustrative, not limiting. It will be further understood that various modifications can be made by those skilled in the art without departing from the true spirit and full scope of the disclosure, including the appended claims and their equivalents. It will also be understood that any of the embodiment (s) described herein may be used in conjunction with any other embodiment (s) described herein.

What is claimed is:

1. A display apparatus comprising:
a display panel;
a chassis supporting the display panel;
a printed circuit board on which an electronic component is mounted, the printed circuit board comprising a first surface facing the chassis, a second surface facing a direction opposite to the first surface, and a through hole penetrating the first surface and the second surface; and
a supporter inserted in the through hole,
wherein the supporter comprises:
a head fixed on the second surface of the printed circuit board;
a first body positioned inside the through hole, and extending from the head toward the chassis;
a second body extending from the first body; configured to reduce interference between the electronic component mounted on the printed circuit board and the chassis, the second body protruding from the through hole toward the chassis with a separation distance therebetween;
an insulating sheet positioned on a side of the chassis facing the first surface of the printed circuit board; and
wherein a width of the second body is greater than a width of the first body.

2. The display apparatus of claim 1, wherein the head of the supporter is clinched.

3. The display apparatus of claim 1, wherein the second body further comprises a bent portion adjacent to the chassis.

4. The display apparatus of claim 1, wherein the second body further comprises a projection having a width greater than a width of the through hole, wherein the supporter is configured to be caught by the first surface via the projection upon insertion into the through hole.

5. The display apparatus of claim 1, wherein a lead of the electronic component mounted on the printed circuit board protrudes toward the chassis with respect to the first surface of the printed circuit board, and
a length of the second body is greater than a length of a portion of the lead of the electronic component protruding outward of the printed circuit board from the first surface.

6. The display apparatus of claim 1, wherein the head is soldered on the second surface,
the second body is soldered on the first surface, and
a via hole is provided inside the supporter.

7. The display apparatus of claim 1, further comprising a cover spaced from the chassis.

8. The display apparatus of claim 1, further comprising a light source comprising light emitting circuitry configured to provide light to the display panel.

9. The display apparatus of claim 3, wherein the second body further comprises an extension portion extending from the bent portion toward the first surface of the printed circuit board.

10. The display apparatus of claim 5, wherein the lead is located inside the supporter, and
the lead is fixed in the supporter by soldering.

11. The display apparatus of claim 7, wherein the head of the supporter is located between the second surface of the printed circuit board and the cover, and
the second body of the supporter is located between the first surface of the printed circuit board and the chassis.

12. The display apparatus of claim 10, wherein the second body further comprises a plurality of solder reinforcement holes arranged along a circumferential direction of the second body.

* * * * *